(12) United States Patent
Schulz-Harder

(10) Patent No.: US 6,475,401 B1
(45) Date of Patent: Nov. 5, 2002

(54) PROCESS FOR THE MANUFACTURE OF SUBSTRATES WITH TEXTURED METALIZATIONS AND HOLDING AND FASTENING ELEMENTS FOR USE IN THIS PROCESS

(76) Inventor: Jurgen Schulz-Harder, Hugo-Dietz-Strasse 32, D-91207 Lauf (DE)

(*) Notice: Subject to any disclaimer, the term of this patent is extended or adjusted under 35 U.S.C. 154(b) by 55 days.

(21) Appl. No.: 09/595,887

(22) Filed: Jun. 20, 2000

(30) Foreign Application Priority Data

Jun. 22, 1999 (DE) .......................................... 199 28 401
Jun. 30, 1999 (DE) .......................................... 199 30 207

(51) Int. Cl.[7] ............................. C23F 1/00; H01B 13/00
(52) U.S. Cl. ............................. 216/20; 216/13; 216/41; 216/100; 174/250
(58) Field of Search ............................. 216/13, 20, 41, 216/100; 174/250

(56) References Cited

U.S. PATENT DOCUMENTS 3,711,626 A * 1/1973 Kilby et al. ................ 174/251
4,862,323 A * 8/1989 Butt .......................... 174/250
5,354,415 A * 10/1994 Fushii et al. ............... 216/108
6,183,588 B1 * 2/2001 Kelly et al. ................ 156/230

FOREIGN PATENT DOCUMENTS

DE 195 09 313 A1 3/1995
DE 196 50 813 A1 12/1996

* cited by examiner

Primary Examiner—Randy Gulakowski
Assistant Examiner—Shamim Ahmed
(74) Attorney, Agent, or Firm—Hoffman, Wasson & Gitler

(57) ABSTRACT

The invention pertains to a new type of process for the manufacture of substrates with textured metalizations and holding and fastening elements for use in this process.

46 Claims, 7 Drawing Sheets

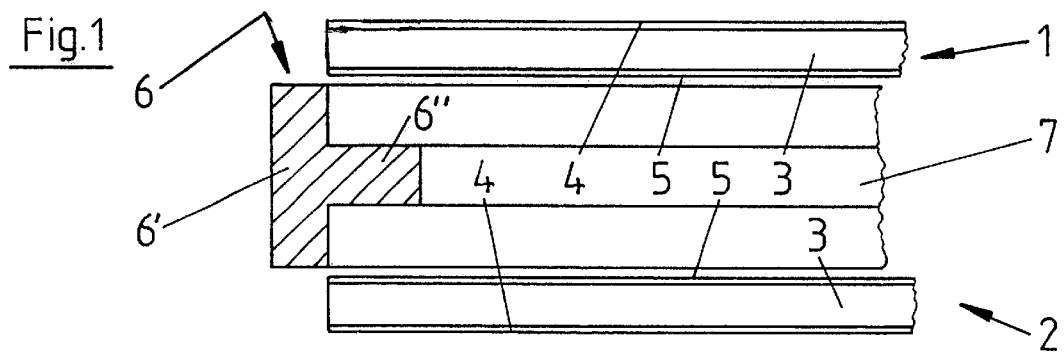
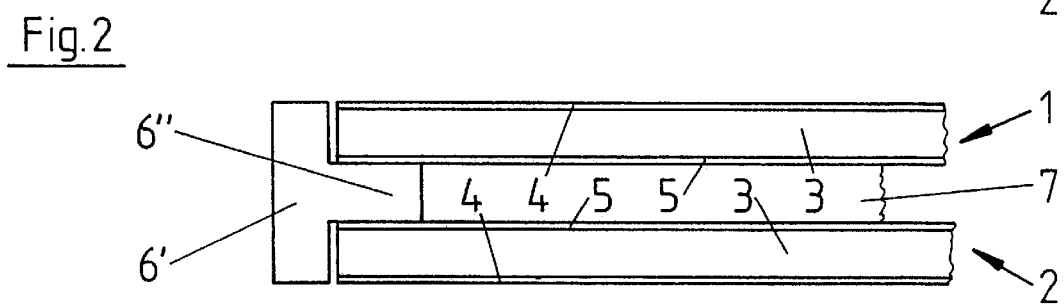
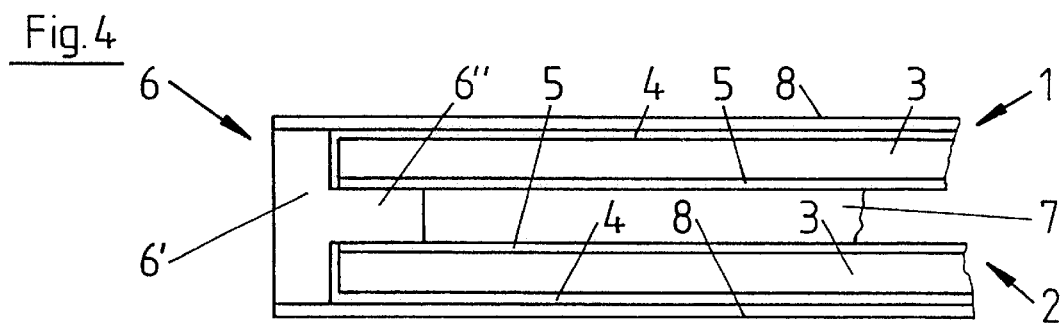
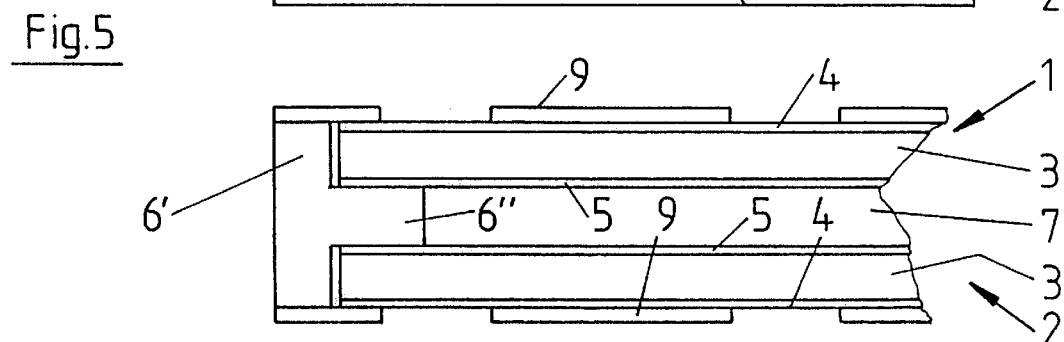
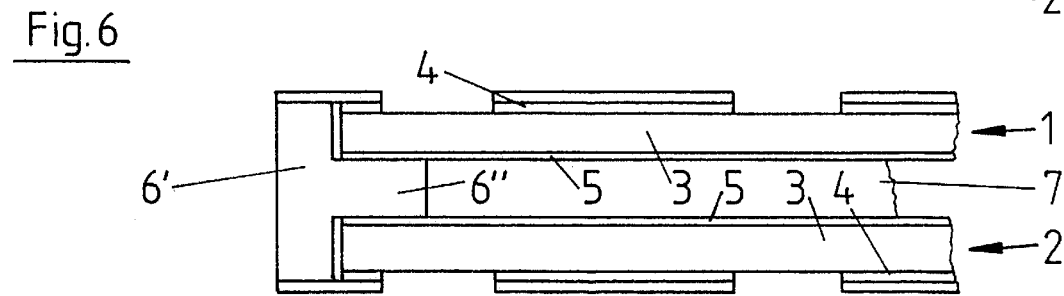

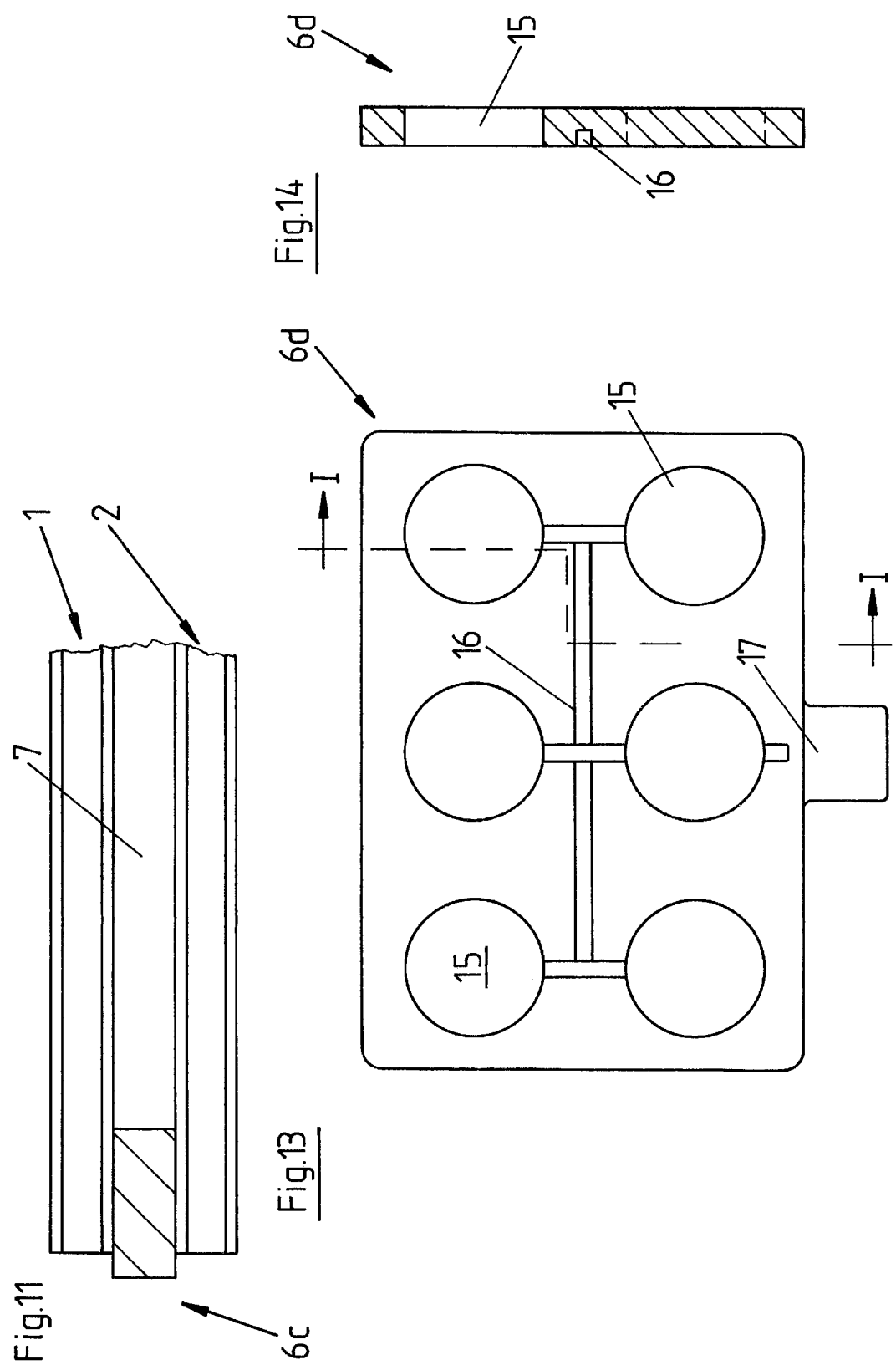

PROCESS FOR THE MANUFACTURE OF SUBSTRATES WITH TEXTURED METALIZATIONS AND HOLDING AND FASTENING ELEMENTS FOR USE IN THIS PROCESS

BACKGROUND OF THE INVENTION

The invention pertains to a process or method for making substrates with textured or structured metalizations. The invention also pertains to a holding and fastening element for the use in such a method.

The manufacture of substrates with textured or structured metalizations for the use as printed boards for electrical devices are known in a variety of models. The texturing generally takes place using a masking or etching process, for example.

The substrates according to the present invention are, for example, ceramic/metal substrates that in their simplest form consist of a ceramic layer that is provided with a metalization on one surface, but preferably on both surfaces, for example in the form of a metal foil applied to the surface.

It is known that these metalizations required for conductors, connections etc. on ceramic, e.g. on aluminum-oxide ceramic are produced by means of the so-called "DCB process" (direct copper bond technology), using metal or copper foils or metal or copper sheets forming the respective metalization that have a layer or a coating (melt-on layer) consisting of a chemical compound of the metal and a reactive gas, preferably oxygen. In this process, which is described for example in U.S. Pat. No. 3,744,120 or DE-PS 23 19 854, this layer or coating (melt-on layer) forms a eutectic system with a melting temperature under the melting temperature of the metal (e.g. copper), so that by application of the foil on the ceramic and by heating all layers these can be connected to each other, by melting on the metal or copper essentially only in the area of the melt-on layer or oxide layer.

This DCB technology exhibits the following processing stages:

Oxidation of a copper foil in such a manner that an even copper oxide layer is formed;

Application of the copper foil to the ceramic layer;

Heating of the compound to a processing temperature between approximately 1025 and 1083° C., e.g. to approx. 1071° C.; Cooling to room temperature.

The substrates according to the present invention are also, for example, such substrates that consist of a base and/or insulating layer made of plastic that is provided with a metalization formed by a metal foil on at least one surface area. The substrates according to the present invention are also known substrates in which a thin insulating layer, for example of plastic, is applied to one base layer made of metal, for example aluminum and which (insulating layer) bears the metalization in the form of a metal foil, for example.

An object of the invention is to present a new process enabling texturing in an extremely efficient nature, especially using known masking and etching technologies.

SUMMARY OF THE INVENTION

In order to attain this object, a process or method for making substrates with textured or structured metalizations is characterized in that for texturing the metalizations of at least two substrates in one process, the two substrates are fastened tightly together in a removable manner, by means of at least one holding or fastening means on one surface side of each substrate, and then, the texturing of the metalizations is performed on the other free outer surface sides of the substrates.

A holding or fastening element for use in such a process is characterized by being formed as a ring or plate-like body made of a sealed material, for example of an elastic or rubber-like material, whereby the body has at least one opening that is closed on its periphery and a bearing surface on each of two opposite sides encompassing the opening.

The process according to the present invention offers the advantage, among other things, that at least two substrates or printed boards can be textured at the same time in one process, each on only one surface (outer surface side), whereby the other surface (inner surface side) or a metalization located there is not affected. The invention offers the additional advantage that a one-sided texturing of printed boards or substrates is possible using the existing equipment normally used for two-sided texturing, so that the same equipment can be used for one-sided and two-sided texturing.

BRIEF DESCRIPTION OF THE DRAWINGS

The invention is described in more detail using example embodiments in the following figures, wherein:

FIG. 1 shows a simplified representation in a partial cross-section of two substrates to be textured, together with a holding or fastening element;

FIG. 2 shows a representation similar to FIG. 1, however with substrates that are tightly connected with each other by means of the holding or fastening element;

FIG. 4–6 show various further steps of the process for simultaneous texturing of the two substrates held together by the holding or fastening element;

FIG. 11 shows two substrates to be textured with a simplified holding or fastening element according to a further embodiment of the invention;

FIG. 13 shows a simplified representation in top view of a further embodiment of a fastening element;

FIG. 14 shows a cross-section corresponding to line 1—1 of FIG. 13; and

DETAILED DESCRIPTION OF THE INVENTION

Figure 3:
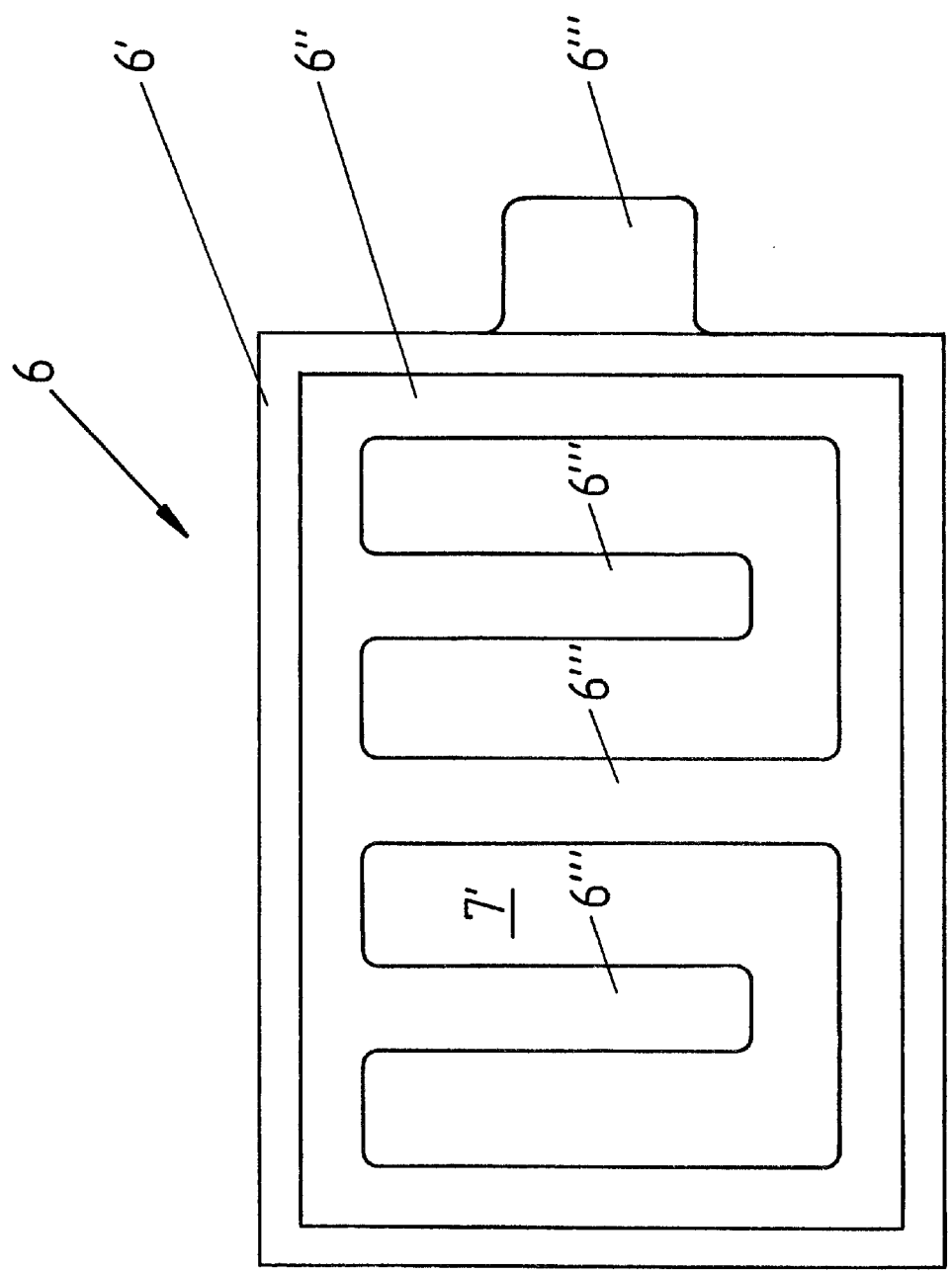
FIG. 3 shows a schematic representation in top view of the array of FIG. 2.

In FIGS. 1–6, 1 and 2 with respect to the depicted embodiment are substrates identical in form, size and structure that in the depicted embodiment both consist of an insulating layer in the form of a ceramic layer 3 and of metalizations 4 or 5 on both surface areas of the ceramic layer 3.

It is the intention of the process described in more detail below to texture both substrates 1 and 2 simultaneously, i.e. in one process, on one surface area or side, respectively, i.e. on the metalization 4, whereby the respective metalization 5 remains unaffected. In the depicted embodiment the metalizations 4 and 5 are formed by metal foils or plates, e.g. by copper foils, that are attached to the upper surface of the ceramic layer 3, respectively, for example using DCB technology or an active soldering process.

As depicted in FIG. 1, the two substrates 1 and 2 with their metalization 5 are placed on a holding or fastening element 6. As also depicted in FIG. 3, this holding or fastening element has the form of a ring made of an air-tight and gas-tight, elastic material, in top view (FIG. 3) of a form that corresponds to the shape of the peripheral edge of the respective substrate 1 or 2, i.e. for rectangular substrates 1 and 2 with a rectangular shape. As these figures also show, the holding or fastening element 6 also has a T-shaped cross-sectional profile that consists of a profile section 6' that extends perpendicular to the plane of the ring of the holding or fastening element 7 and forms the outer edge of this ring, and of a profile section 6". The latter lies with its length in the plane of the ring formed by the holding and fastening element 6 and extends from the middle of the height of the profile section 6' radially inward. The profile section 6" forms a ring-shaped area, on which the two substrates 1 and 2 lie with their metalization 5 on the periphery of the substrate. The profile section 6' covers the substrates 1 and 2 along the periphery on the peripheral surface or face there and extends in the depicted embodiment for substrates 1 and 2 provided with a holding or fastening element 6 to the respective outer metalizations 4.

As shown in FIG. 3, finger-like profile sections 6''' are provided for on the profile section 6" that extend into the closed space 7 formed by the holding and fastening element 6 and the substrates 1 and 2 and thus have the same thickness of the profile section 6" perpendicular to the plane of the substrates 1 and 2. The profile sections 6''' thus form an additional base of the substrates 1 and 2 within the ring opening of the holding or fastening element 6 and prevent excessive tensions in the substrates due to the vacuum in the space 7.

After placing the substrates 1 and 2 onto the holding or fastening element 6, the space 7 formed between the spaced substrates is evacuated to the negative pressure P. In order to create the negative pressure P in the space 7 the array or stack consisting of the substrates 1 and 2 is brought into a chamber that evacuates to the negative pressure and then more or less immediately, i.e. in a very short period of time, for example in a period of less than 10 seconds, is ventilated to the ambient pressure Pa so that due to the sudden change in pressure the substrates 1 and 2 are pressed with their edge against the fastening element so that practically no ventilation of the space 7 to the atmosphere takes place.

The vacuum in the space 7 is selected such that the pressure P there after the evacuation is smaller than 80% of the ambient pressure Pa. Due to the elastic material used for the holding or fastening element 6, a tight seal of the space 7 is ensured by the fastening element 6, so that the substrates are securely held together during the following steps of the process.

In further step of the process, a layer 8 made of a photosensitive resist is applied on the two outer and thus open metalizations 4, for example by immersing the array consisting of the two substrates 1 and 2 and the fastening element 6 in the photosensitive resist. Both photosensitive resists 8 are then exposed according to the respective desired texturing or structuring, either at the same time or one after the other. Afterwards, the exposed photosensitive resist 8 is developed in order to form the masks 9 of photosensitive resist from the metalizations 4 (FIG. 5). In a further process step the two-sided etching of the metalizations 4 of both substrates 1 and 2 takes place using the photosensitive masks, so that after removal of the photosensitive masks 9 the two substrates 1 and 2 are produced with the texturing on the metalizations 4.

As the figures also show, the photosensitive resist 8 is applied in such a way that it also covers the space between the periphery of the respective substrate 1 and 2 and the part of the profile section 6' covering this substrate on the edge, so that in a corresponding embodiment of the photo mask 9 this space is protected against the penetration of etching liquid during the etching process.

The separation of the substrates 1 and 2 from the fastening element 6 is effected by ventilation of the space 7, for example by gripping the elastic fastening element 6 at a position with a profile section 6"" integrated on the outer profile section 6' and pulled outward so that pressure equalization with the outer environment can take place through the opening thus formed.

The opening can generally take place in such a way that, in order to ventilate the space 7, the array consisting of the substrates 1 and 2 and the fastening element 6 again enters a space that is evacuated to a pressure equal to or approximately equal to the pressure P and then very slowly ventilated to the ambient pressure Pa, so that the interior space 7 is slowly ventilated without pressing the substrates 1 and 2 against the fastening element 6 and thus without breaking the seal of the substrates to the fastening element 6.

In the foregoing description, it was assumed that the masks 9 are made of a photosensitive resist. Of course, other masks of an etch resistive can be used.

Figure 7:
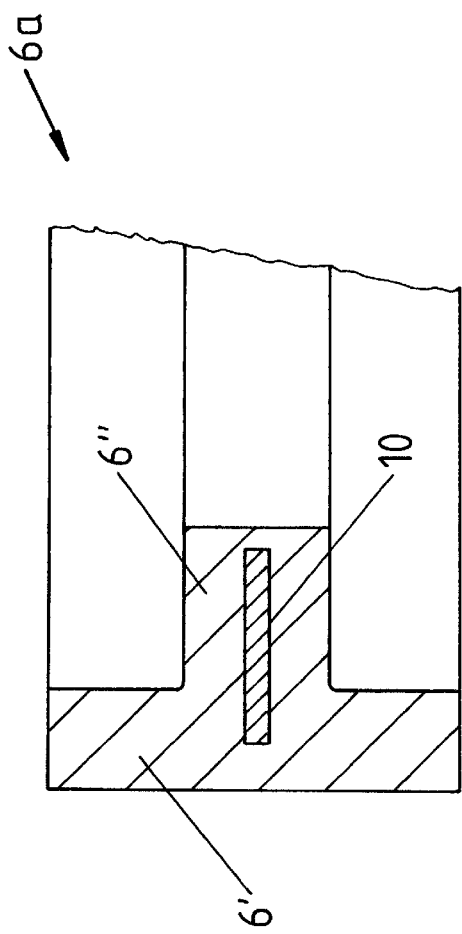
FIG. 7 shows an enlarged partial view in cross-section through the fastening or holding element for use in the process.
Figure 8:
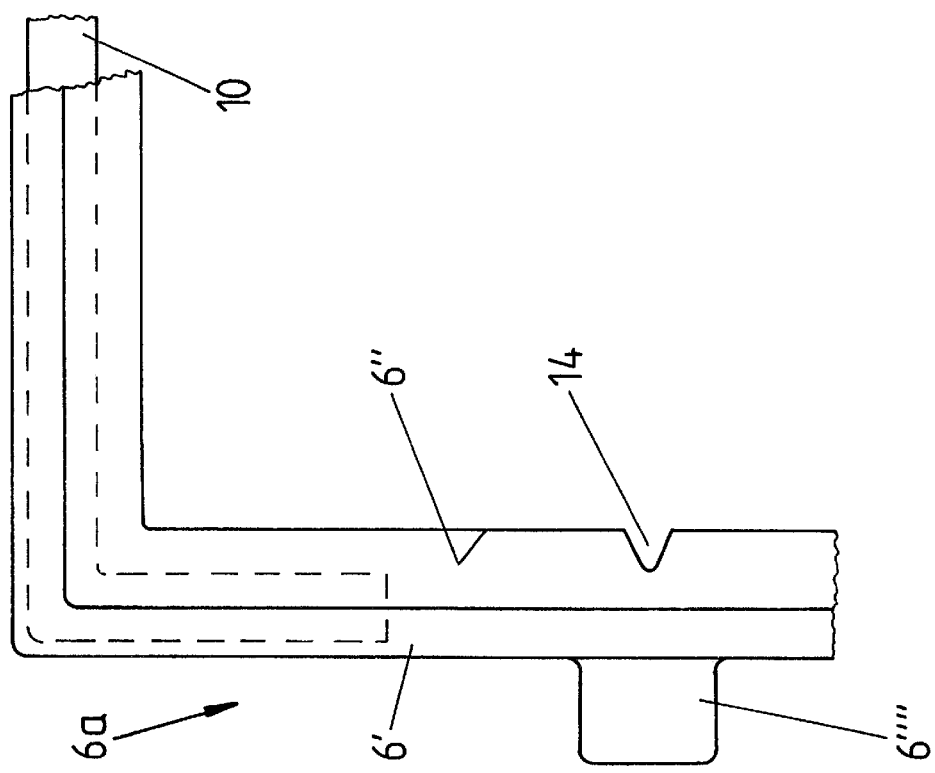
FIG. 8 shows a simplified partial representation of the holding or fastening element of FIG. 7 in top view.

FIGS. 7 and 8 show as a further possible embodiment a fastening element 6a, which differs from the fastening element 6 only by an embedded metal insert 10 that, in the depicted embodiment, forms an essentially C-shaped clasp that is open in the area of the section 6"". Due to the metal insert 10 the ring-shaped fastening element 6 receives an essentially solid structure that enables simpler handling, especially the connection with the substrates 1 and 2. The metal insert 10 is completely surrounded by the material of the fastening element 6a.

Figure 9:
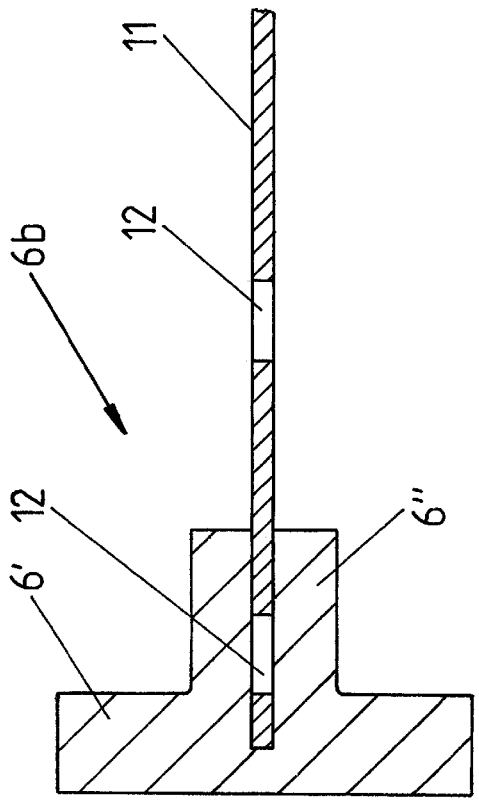
FIG. 9 shows a representation similar to FIG. 7 of a further possible embodiment of the holding or fastening element.
Figure 10:
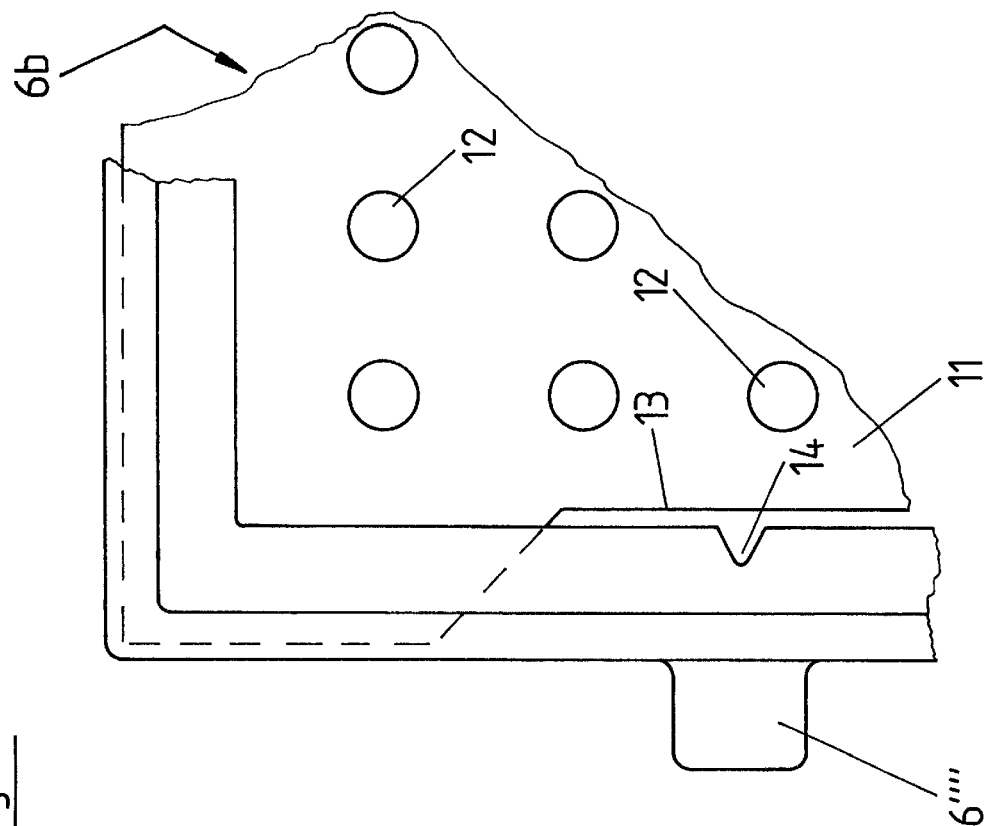
FIG. 10 shows a partial representation in top view of the holding and fastening element of FIG. 9.

FIGS. 9 and 10 show in representations similar to FIGS. 6 and 7 a further possible embodiment, in which, however, instead of the metal insert 10 a reinforcement plate 11 made of a suitable material, for example of metal, is provided for and that extends in the middle plane of the ring-like fastening element 6b and is embedded on the edge at least in the profile section 6" as well as in the profile sections 6'''. The plate 11 is a perforated plate with a number of openings 12 that not only improve the integration of the plate 11 in the elastic material of the profile sections 6" and 6''', but at the same time also create a connection between the two sides of the plate 11, so that for the use of the fastening element 6b between the substrates 1 and 2 only a single space 7 is formed that is to be evacuated. In order to enable ventilation by pulling on the profile section 6"", the plate 11 is provided with a notch 13 in the area of this profile section in such a way that the plate 11 is not embedded in the profile section 6" with its edge. Opposite of the profile section 6" an indentation 14 is provided for on the profile section 6" that eases the ventilation of the space 7 by pulling on the profile section 6"".

Figure 12:
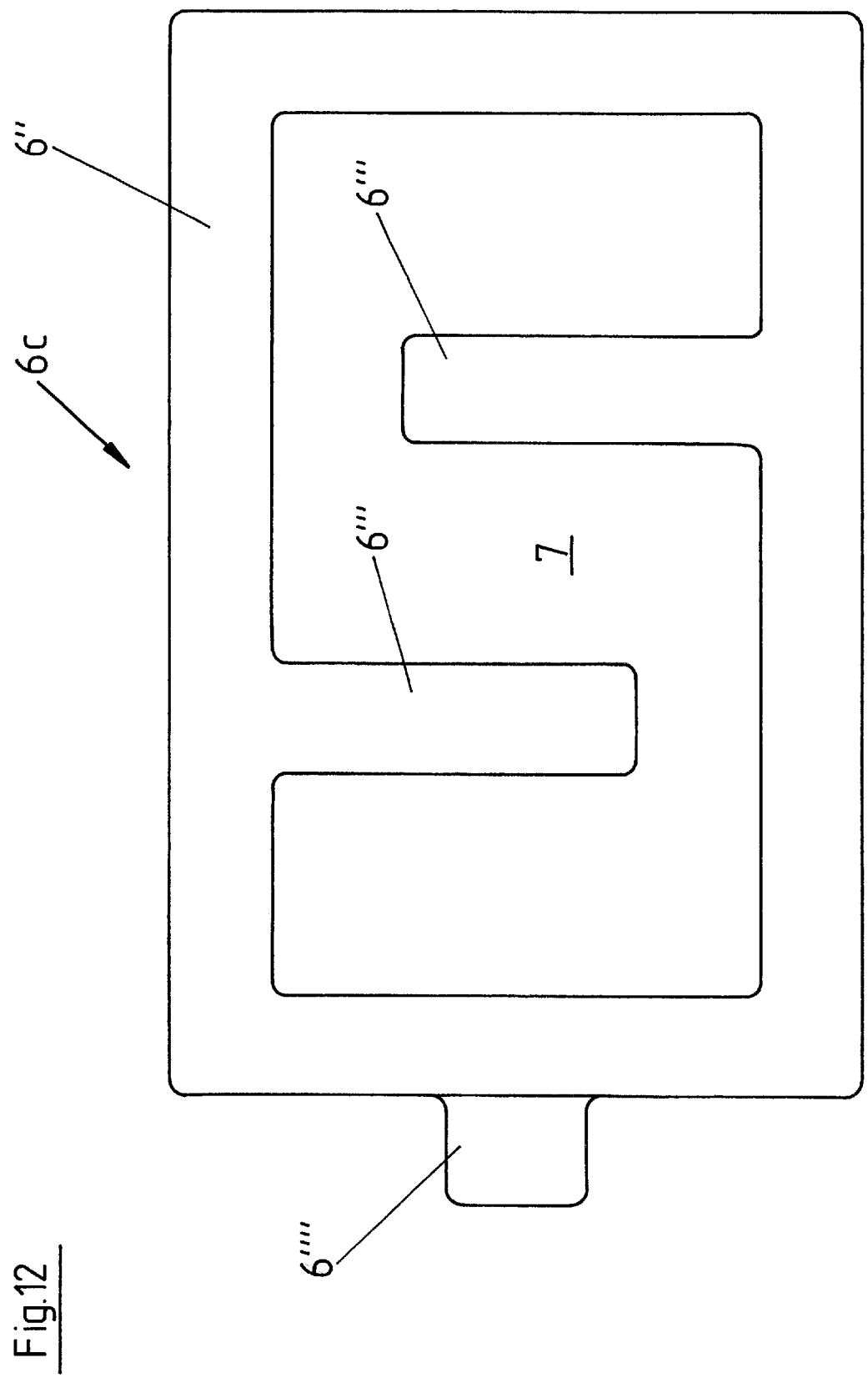
FIG. 12 shows a simplified representation in top view of the fastening element of FIG. 11.

FIGS. 11 and 12 show as a further possible embodiment a fastening element 6c that consists essentially of a simple flat ring made of the elastic material, i.e. without the profile section 6' and only with the profile sections 6"–6"".

FIGS. 13 and 14 show as a further embodiment a fastening element 6d that consists essentially of a plate made of the elastic, rubber-like material. In this plate, several continuous openings 15 are provided for that are connected on one side of the plate by groove-shaped channels 16. On one side of the plate a heel 17 corresponding to the profile section 6"" is integrated that lies adjacent to an opening 15. In the depicted embodiments, one of the channels 16 extends to the vicinity of the heel 17, but ends with a predefined distance before this heel or the corresponding peripheral side of the fastening element 6d. If used, the plate-shaped fastening element 6d is located between the two substrates 1 and 2. Afterwards an evacuation of the spaces formed by the openings 15 between the two substrates 1 and 2 takes place. These spaces are connected with each other via the channels 16. The evacuated interior spaces formed by the openings 15 and the channels 16 are sealed off from the atmosphere by the substrates 1 and 2, so that the adjacent substrates 1 and 2 are held together by negative pressure by means of the fastening element 6d. After treatment, the substrates 1 and 2 can be removed from the fastening elements by pulling on the heel 17.

In the above description it was assumed that the substrates 1 and 2 are both metal/ceramic substrates, especially ones in which the ceramic layer 3 is provided with a metalization 4, 5 on both sides that was applied on the surface in the form of a metal foil using DCB or active soldering technology. In general, other designs are conceivable, for example substrates that have a metalization on only one side, substrates whose metalization is produced by another technology, such as thick-film technology on one or two surface sides, etc.

Figure 15:
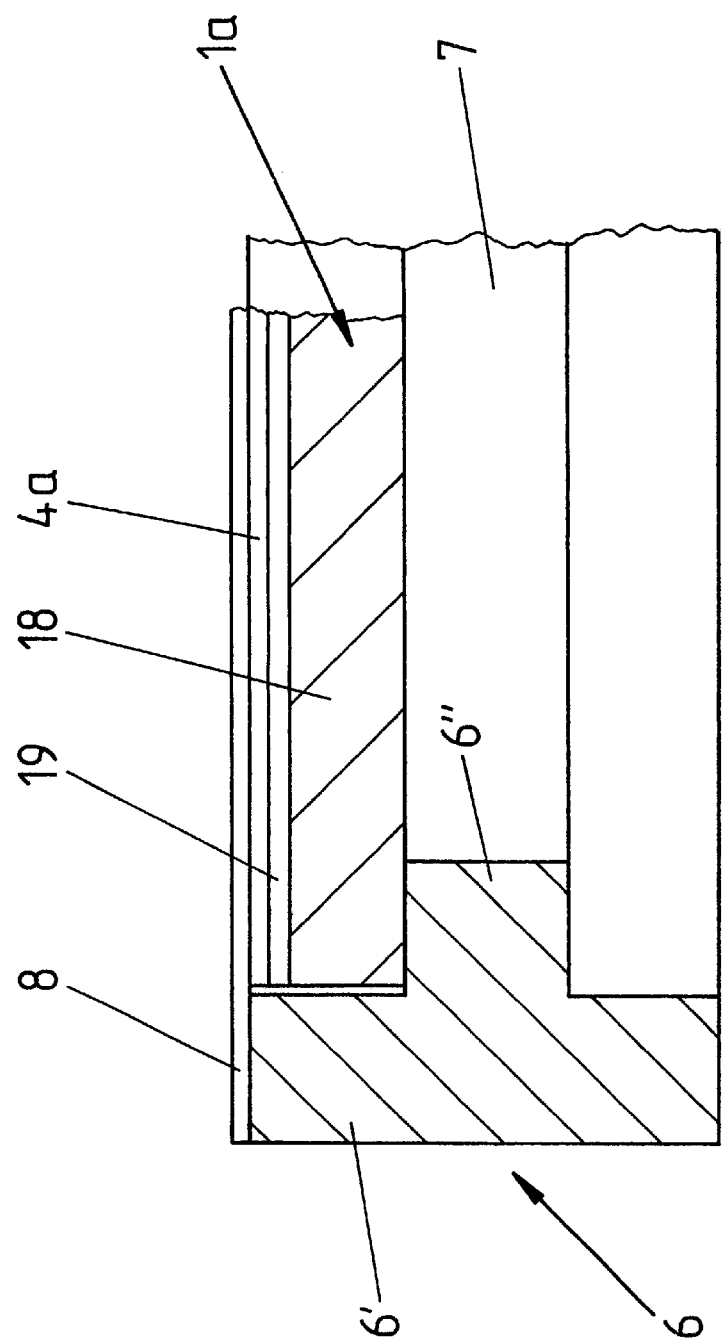
FIG. 15 shows a representation similar to FIG. 7 of a further possible embodiment.

FIG. 15 shows a substrate 1a consisting of a base layer 18 made of aluminum that is provided with a thin insulating layer 19 on one surface side on which (insulating layer) the metalization 4a to be textured is applied. For the texturing, the metalization 4a is likewise coated with the photosensitive resist 8, from which the photosensitive mask is formed for the texturing by the later etching. The photosensitive resist 8 in this embodiment likewise covers the gap between the profile section 6' and the edge of the substrate 1a.

By using the process according to the present invention, especially by using a fastening element 6, 6a, 6b with the profile section 6' and the bridging of the gap between the edge of the substrate 1a and the area 6' by the mask 9, an unwanted effect on the base layer 18 by the etching liquid during etching is prevented.

The invention was described above using a sample embodiment. Of course, numerous alterations and adaptations are possible without abandoning the underlying inventive idea of the invention.

| List of reference symbols | |
| --- | --- |
| 1, 2 | substrate |
| 3 | ceramic layer |
| 4, 5 | metalization |

| -continued | |
| --- | --- |
| List of reference symbols | |
| 6, 6a, 6b, 6c, 6d | fastening element |
| 6', 6", 6"', 6"" | profile section |
| 7 | space |
| 8 | photosensitive resist |
| 9 | mask |
| 10 | metal insert |
| 11 | reinforcing plate |
| 12 | opening |
| 13 | notch |
| 14 | indentation |
| 15 | opening |
| 16 | channel |
| 17 | heel |

What is claimed is:

1. A process or method for making substrates with textured or structured metalizations, wherein at least two substrates are fastened tightly together in a removable manner by means of at least one holding or fastening means on one surface side of each substrate, and texturing of the metalizations on an other free surface side of the at least two substrates, wherein at least one ring or plate element is used as a holding or fastening element forming a sealed space between the at least two substrates is evacuated.

2. The process according to claim 1, wherein the at least two substrates have at least one insulating layer on a surface side with the textured metalization in a form of a metal foil that is connected to said surface of the insulating layer.

3. The process according to claim 2, wherein the insulating layer is a ceramic layer.

4. The process according to claim 2, wherein the insulating layer is a layer made of a plastic material.

5. The process according to claim 1, wherein the at least two substrates are metallized on both surface sides.

6. The process according to claim 1, wherein the substrate comprises a base layer made of aluminum, with a metalization on at least one surface side that is insulated from the base layer by an insulating layer.

7. The process according to claim 1, wherein the at least two substrates are connected with each other in a removable manner by at least one holding or fastening element.

8. The process according to claim 1, wherein the fastening element is located between the at least two substrates, the fastening element is an elastic material seal that forms at least one space between the at least two substrates and can be placed under negative pressure.

9. The process according to claim 1, wherein the fastening element covers the at least two substrates on a periphery.

10. The process according to claim 1, wherein at least two substrates are connected with each other in a removable manner by means of vacuum or negative pressure, the negative pressure (P) is less than 80% of ambient pressure (Pa).

11. The process according to claim 1, wherein the at least one fastening means has a number of vacuum spaces that are connected with each other.

12. The process according to claim 1, wherein the at least one fastening means has at least one vacuum space into which sections forming one or more additional supports for the at least two substrates extend.

13. The process according to claim 1, wherein the at least one holding or fastening means has a reinforcement made of metal incorporated therein.

14. The process according to claim 1, wherein the texturing of the metalization takes place by means of etching with etching masks.

15. The process according to claim 14, wherein a mask is formed from an etch resist such that said mask bridges a connecting area between an edge of the at least two substrates and an adjacent profile section of the at least one fastening means.

16. The process according to claim 1, wherein for evacuation of at least one space between the substrates, a stack formed by the substrates and the at least one fastening means is subjected to a negative pressure (P) and then subjected to an ambient pressure (Pa) for a short period of time.

17. The process according to claim 1, wherein removal of the at least two substrates from the at least one fastening means is performed by ventilation of the at least one space between the at least two substrates.

18. The process according to claim 17, wherein the ventilation of the at least one space between the substrates takes place by means of mechanical lifting of the at least one fastening means.

19. The process according to claim 1, wherein removal of the at least two substrates from the at least one fastening means takes place by placing an array under negative pressure and by slow ventilation.

20. A holding or fastening element for use in the process according to claim 1, wherein the holding or fastening element is formed as a ring or plate body made of a sealed material, the material is an elastic or rubber material, whereby the body has at least one opening that is closed on its periphery and a bearing surface on each of two opposite sides encompassing the opening.

21. The holding or fastening element according to claim 20, wherein one profile section forms an edge extending beyond the bearing surfaces for covering of the at least two substrates on their periphery.

22. The holding or fastening element according to claim 20, further comprising a number of openings that are connected with each other.

23. The holding or fastening element according to claim 20, further comprising an integral section extending outward beyond the ring or plate for partial lifting of the holding or fastening element.

24. The holding or fastening element according to claim 20, further comprising a reinforcement made of metal has been incorporated into said element.

25. A process or method for making substrates with textured or structured metalizations, comprising the steps of fastening at least two substrates tightly together in a removable manner by means of at least one holding or fastening means on one surface side of each substrate, and texturing of the metalizations on an other free surface side of the at least two substrates, wherein the at least one holding or fastening means is an elastic material seal that forms at least one sealed space between the at least two substrates, and wherein the at least one sealed space between the at least two substrates is evacuated.

26. The process according to claim 25, wherein the at least two substrates have each at least one insulating layer on a surface side with the metalization in a form of a metal foil that is connected to said surface of the insulating layer.

27. The process according to claim 26, wherein the insulating layer is a ceramic layer.

28. The process according to claim 26, wherein the insulating layer is a layer made of a plastic material.

29. The process according to claim 25, wherein the at least two substrates are metallized on both surface sides.

30. The process according to claim 25, wherein the substrate comprises a base layer made of aluminum, with a metalization on at least one surface side that is insulated from the base layer by an insulating layer.

31. The process according to claim 25, wherein the fastening element covers the at least two substrates on an periphery.

32. The process according to claim 25, wherein the at least one fastening element has a number of vacuum spaces that are connected with each other.

33. The process according to claim 25, wherein the at least one fastening element has at least one vacuum space into which sections forming one or more additional supports for the at least two substrates extend.

34. The process according to claim 25, wherein the at least one holding or fastening element has a reinforcement made of metal incorporated therein.

35. The process according to claim 25, wherein the texturing of the metalization takes place by means of etching with etching masks.

36. The process according to claim 35, wherein a mask is formed from an etch resist such that said mask bridges a connecting area between an edge of the at least two substrates and an adjacent profile section of the at least one fastening means.

37. The process according to claim 25, wherein for evacuation of the at least one space between the substrates, a stack formed by the substrates and the at least one fastening element is subjected to a negative pressure and then subjected to an ambient pressure (Pa) for a short period of time.

38. The process according to claim 25, wherein removal of the at least two substrates from the at least one fastening means is performed by ventilation of the at least one space between the at least two substrates.

39. The process according to claim 38, wherein the ventilation of the at least one space between the substrates takes place by means of mechanical lifting of the at least one fastening means.

40. The process according to claim 25, wherein removal of the at least two substrates from the at least one fastening means takes place by placing an array under negative pressure and by slow ventilation.

41. The holding or fastening element for the use in the process according to claim 25, wherein the holding or, fastening element is formed as a ring or plate body made of a sealed material, the material is an elastic or rubber material, whereby the body has at least one opening that is closed on its periphery and a bearing surface on each of two opposite sides encompassing the opening.

42. The holding or fastening element according to claim 41, wherein one profile section forms an edge extending beyond the bearing surfaces for covering of the at least two substrates on their periphery.

43. The holding or fastening element according to claim 41, further comprising a number of openings that are connected with each other.

44. The holding or fastening element according to claim 41, further comprising an integral section extending outward beyond the ring or plate for partial lifting of the holding or fastening element.

45. The holding or fastening element according to claim 41, further comprising a reinforcement made of metal has been incorporated into said element.

46. The process according to claim 25, wherein at least one ring or plate element made of elastic material is used as holding or fastening element forming a sealed space between the at least two substrates.

* * * * *